(12) United States Patent
Kim

(10) Patent No.: US 8,487,369 B2
(45) Date of Patent: Jul. 16, 2013

(54) SEMICONDUCTOR DEVICE WITH BURIED GATES AND BURIED BIT LINES AND METHOD FOR FABRICATING THE SAME

(75) Inventor: Su-Young Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 346 days.

(21) Appl. No.: 12/833,073

(22) Filed: Jul. 9, 2010

(65) Prior Publication Data

US 2011/0101450 A1 May 5, 2011

(30) Foreign Application Priority Data

Oct. 30, 2009  (KR) .................. 10-2009-0104626
Oct. 30, 2009  (KR) .................. 10-2009-0104641

(51) Int. Cl.
*H01L 29/78* (2006.01)
*H01L 21/28* (2006.01)

(52) U.S. Cl.
USPC ........... 257/330; 257/228; 257/229; 257/332; 257/506; 257/E21.008; 257/E21.19; 257/E29.255; 438/259; 438/262; 438/270; 438/424; 438/589

(58) Field of Classification Search
USPC .......... 257/228, 229, 330, 332, 506, E21.008, 257/E21.19, E29.255; 438/259, 262, 270, 438/424, 589
See application file for complete search history.

(56) References Cited

U.S. PATENT DOCUMENTS

| 6,555,866 | B1 * | 4/2003 | Kuo | 257/314 |
|---|---|---|---|---|
| 8,034,684 | B2 * | 10/2011 | Park | 438/262 |
| 8,093,125 | B2 * | 1/2012 | Kim | 438/259 |
| 2010/0258858 | A1 * | 10/2010 | Kim | 257/330 |
| 2012/0001346 | A1 * | 1/2012 | Kim et al. | 257/774 |
| 2012/0074518 | A1 * | 3/2012 | Kim et al. | 257/506 |

FOREIGN PATENT DOCUMENTS

| KR | 100144899 | 7/1998 |
|---|---|---|
| KR | 1020090104969 | 10/2009 |

OTHER PUBLICATIONS

Notice of Preliminary Rejection issued from Korean Intellectual Property Office on Feb. 16, 2011.

* cited by examiner

*Primary Examiner* — Dao H Nguyen
(74) *Attorney, Agent, or Firm* — IP & T Group LLP

(57) ABSTRACT

A semiconductor device includes: a plurality of first trenches formed inside a plurality of active regions; a plurality of buried gates configured to partially fill insides of the plurality of the first trenches; a plurality of second trenches formed to be extended in a direction crossing the plurality of the buried gates; and a plurality of buried bit lines configured to fill the plurality of the second trenches.

15 Claims, 21 Drawing Sheets

SEMICONDUCTOR DEVICE WITH BURIED GATES AND BURIED BIT LINES AND METHOD FOR FABRICATING THE SAME

CROSS-REFERENCES TO RELATED APPLICATIONS

The present application claims priority of Korean Patent Application Nos. 10-2009-0104626 and 10-2009-0104641, both filed on Oct. 30, 2009, which are incorporated herein by reference in their entirety.

BACKGROUND OF THE INVENTION

Exemplary embodiments of the present invention relate to a method for fabricating a semiconductor device, and more particularly, to a semiconductor device with buried gates and buried bit lines, and a method for fabricating the semiconductor device.

Recently, semiconductor device fabrication processes are being developed to have an increased degree of integration. Among diverse methods for securing reliability and integration degree of a semiconductor device is a method of using buried gates. The parasitic capacitance between a gate and a bit line can be remarkably reduced by burying the gate in the inside of an active region. The gate buried in the inside of an active region is referred to as a buried gate. With the buried gate, the sensing margin of a memory device can be considerably improved.

FIG. 1 is a cross-sectional view illustrating a conventional semiconductor device with buried gates.

Referring to FIG. 1, the semiconductor device includes a semiconductor substrate 11 with an active region 13 defined by an isolation layer 12, trenches 14 which are formed by simultaneously etching the active region 13 and the isolation layer 12, a buried gate 16 filling a portion of each trench 14, and a gap-filling layer 17 filling the other portion of the trench 14 over the buried gate 16. The semiconductor device also includes a gate insulation layer 15 formed between the buried gate 16 and the trench 14. In the active region 13, a bit line 18 is coupled with a storage node contact 19. The bit line 18 is coupled with the active region 13 through a bit line contact hole 18A. The bit line contact hole 18A is formed in a first inter-layer dielectric layer 20, and the storage node contact 19 is coupled with the active region 13 through a second inter-layer dielectric layer 21 and the first inter-layer dielectric layer 20.

According to the conventional technology shown in FIG. 1, only the buried gate 16 is formed in the inside of the active region 13, and the bit line 18 is coupled with the active region 13 through the bit line contact hole 18A.

The conventional technology described above, however, has the following drawbacks.

First, when the bit line contact hole 18A is formed for high integration, the size of the contact hole should be formed small. In this case, when the contact hole is formed too small, the contact hole may not be opened, which is called a contact-hole-not-open phenomenon. In this case, it may be impossible to perform a mask process.

Second, when the bit line 18 is formed, a process of forming a nitride spacer 18B, which surrounds the bit line 18, needs to be performed to prevent a short from occurring between the storage node contact 19 and the bit line 18. With the nitride spacer forming process performed additionally, the cross-sectional area of a bit line may be reduced so as to increase resistance.

Third, since the bit line 18 is positioned in the upper portion of the active region 13, the connection portion with the active region 13 may become weak when a storage node contact hole for the storage node contact 19.

Fourth, the over-lay margins of the bit line 18 and the bit line contact hole 18A are so poor that the bit line 18 and the bit line contact hole 18A may be bridged with an adjacent storage node contact and thus a self-alignment contact failure of the storage node contact is highly likely to occur.

SUMMARY OF THE INVENTION

An embodiment of the present invention is directed to a semiconductor device which may reduce the resistance of a bit line and prevent a bridging between a bit line and a storage node contact, and a method for fabricating the semiconductor device.

Another embodiment of the present invention is directed to a semiconductor device that may secure process margins during a storage node contact forming process, and a method for fabricating the semiconductor device.

In accordance with an embodiment of the present invention, a semiconductor device may include: a plurality of first trenches formed inside a plurality of active regions; a plurality of buried gates configured to partially fill insides of the plurality of the first trenches; a plurality of second trenches formed to be extended in a direction crossing the plurality of the buried gates; and a plurality of buried bit lines configured to fill the plurality of the second trenches.

In accordance with another embodiment of the present invention, a method for fabricating a semiconductor device may include: forming a plurality of buried gates to fill insides of a plurality of active regions; forming a plurality of trenches by etching the plurality of the active regions between the plurality of the buried gates; and forming a plurality of buried bit lines to fill the plurality of the trenches.

In accordance with yet another embodiment of the present invention, a method for fabricating a semiconductor device may include: forming a plurality of first trenches by etching a substrate having a plurality of active regions defined therein; forming a plurality of buried gates to partially fill insides of the plurality of the first trenches; forming a diffusion barrier over a substrate structure including the plurality of the buried gates; forming a gap-filling layer over the diffusion barrier to gap-fill upper portions of the plurality of the buried gates; forming a plurality of second trenches by sequentially etching the gap-filling layer, the diffusion barrier, and the substrate between the plurality of the buried gates; and forming a plurality of buried bit lines to fill the plurality of the second trenches.

In accordance with still another embodiment of the present invention, a method for fabricating a semiconductor device may include: forming a plurality of first trenches by etching a substrate; forming a plurality of buried gates to fill the plurality of the first trenches; forming a plurality of second trenches by etching the substrate in a direction crossing the plurality of the buried gates; forming a plurality of third trenches by extending the plurality of the second trenches in parallel to the plurality of the buried gates; and forming a plurality of buried bit lines to fill the plurality of the third trenches and the plurality of the second trenches.

DESCRIPTION OF SPECIFIC EMBODIMENTS

Figure 1:
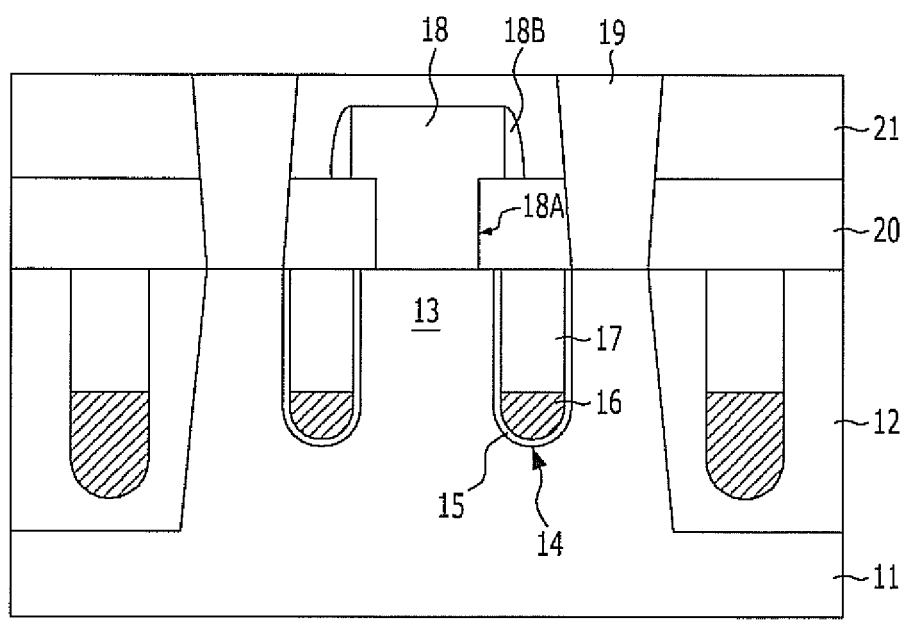
FIG. 1 is a cross-sectional view illustrating a conventional semiconductor device with buried gates.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
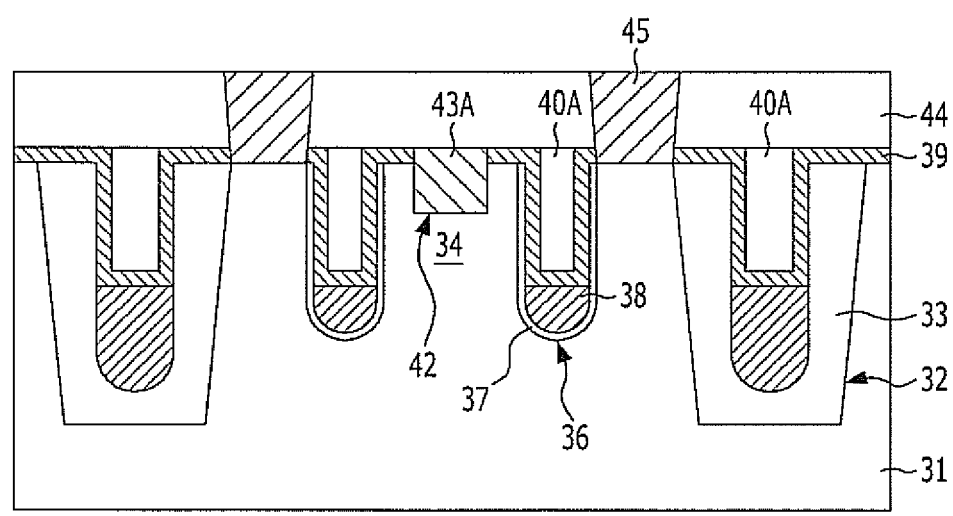
FIG. 2 is a cross-sectional view illustrating the semiconductor device fabricated in accordance with a first embodiment of the present invention.

FIG. 2 is a cross-sectional view illustrating the semiconductor device fabricated in accordance with a first embodiment of the present invention.

Referring to FIG. 2, the semiconductor device includes a plurality of first trenches 36 formed in the inside of an active region 34, a buried gate 38 filling a portion of the inside of an individual first trench 36, a second trench 42 formed in the inside of the active region 34 between buried gates 38, and a buried bit line 43A filling the second trench 42. The semiconductor device also includes storage node contacts 45 formed at both ends of the active region 34 to penetrate an inter-layer dielectric layer 44.

Each active region 34 is defined by an isolation layer 33 over a substrate 31, and the active region 34 has a shape of island slanted in an oblique direction. The isolation layer 33 is formed to fill an isolation trench 32 through a Shallow Trench Isolation (STI) process.

The buried gate 38 and the buried bit line 43A are formed crossing each other, and the intersection point between the buried gate 38 and the buried bit line 43A is not positioned in the upper portion of the active region 34 but in the upper portion of the isolation layer 33.

The second trench 42 has a shallower depth than the first trench 36, and the second trench 42 is formed at a position higher than the surface of the buried gate 38 to isolate the buried bit line 43A from the buried gate 38. A gate insulation layer 37 is formed on the surface of the first trench 36. A diffusion barrier 39 and a gap-filling layer pattern 40A are formed in the upper portion of the buried gate 38 which fills a portion of the first trench 36.

The buried bit line 43A includes a metal material, which is a titanium nitride layer, a tungsten layer, or a copper layer. When the copper layer is used, the buried bit line 43A may further include a diffusion barrier against copper, which may be simply referred to as a copper diffusion barrier. The copper diffusion barrier includes a nitride layer. A structure with the copper diffusion barrier will be described later with reference to FIG. 3I.

According to the structure shown in FIG. 2, the semiconductor device according to the first embodiment includes both buried gate 38 and buried bit line 43A.

FIGS. 3A to 3H are cross-sectional views describing a process for fabricating the semiconductor device in accordance with the first embodiment of the present invention.

Figure 3A:
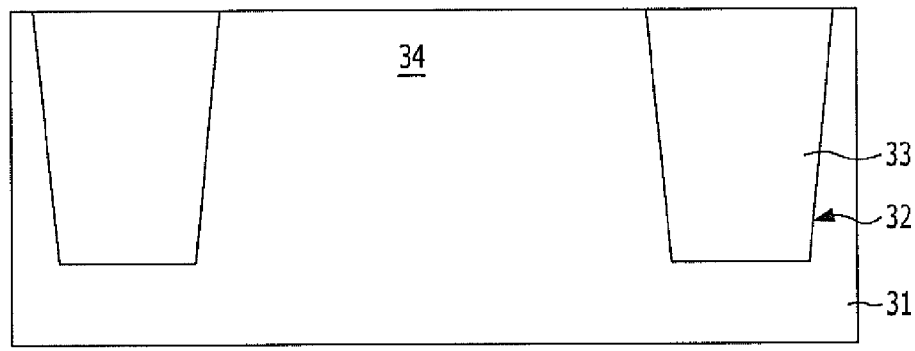
FIGS. 3A to 3H are cross-sectional views describing a process for fabricating the semiconductor device in accordance with the first embodiment of the present invention.

Referring to FIG. 3A, an isolation layer 33 is formed over the substrate 31 by performing a Shallow Trench Isolation (STI) process. Herein, the isolation layer 33 is formed by etching the substrate to a predetermined depth so as to form an isolation trench 32 and gap-fill the isolation trench 32 with an insulation layer such as a spin on dielectric (SOD) material or high-density plasma oxide (HDP). After gap-filling the isolation trench 32 with the insulation layer, a planarization process such as a Chemical Mechanical Polishing (CMP) may be performed.

With the isolation layer 33 formed, the other area of the substrate 31 is defined as active regions 34. The active regions 34 may be laid out in a shape of island slanted at a predetermined angle in an oblique direction to cope with high-integration design rule of under $6F^2$.

Figure 3B:
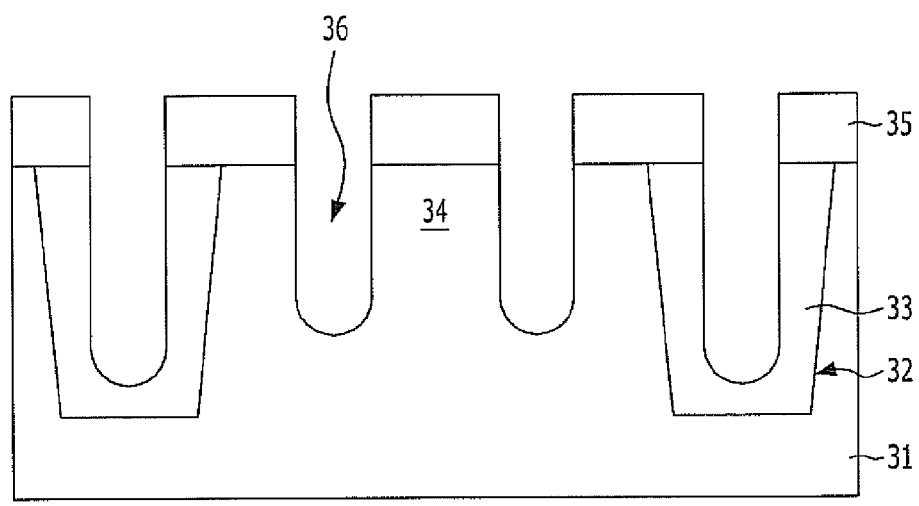

Referring to FIG. 3B, mask and etch processes are performed to form buried gates. For example, a hard mask pattern 35 is formed using a buried gate mask (not shown). The hard mask pattern 35 may include an oxide layer or a nitride layer. Subsequently, the substrate 31, particularly, the active region 34, is etched using the hard mask pattern 35 as an etch barrier. As a result, a first trench 36 having a predetermined depth is formed, and the first trench 36 may be formed by simultaneously etching the active region 34 and the isolation layer 33.

The first trench 36 is a trench which will be filled with a buried gate. The depth of the first trench 36 is shallower than that of the isolation trench 32 filled with the isolation layer 33. Also, the depth of the first trench 36 may be deeper than that of a trench according to conventional technology in order to be sufficiently isolated from a buried bit line which is to be formed subsequently.

Figure 3C:
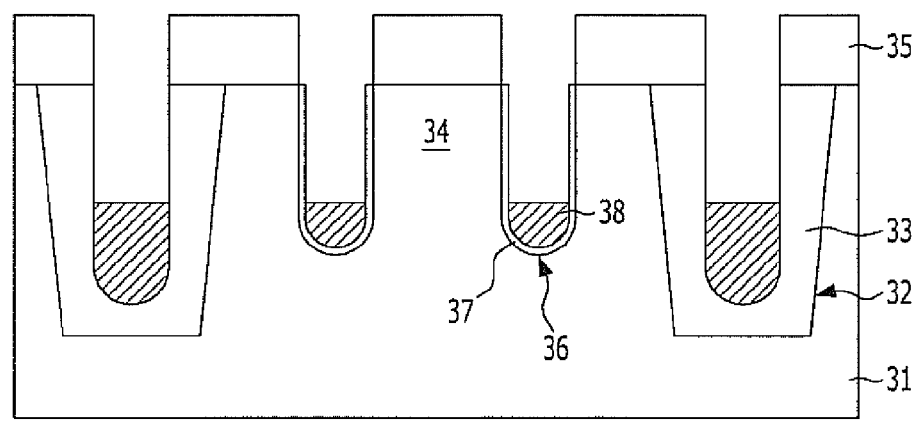

Referring to FIG. 3C, after a gate insulation layer 37 is formed on the surface of the first trench 36, the buried gate 38 filling a portion of the first trench 36 is formed.

The method for forming the buried gate 38 may be performed in a sequence of depositing a gate conductive layer, performing a CMP process, and performing an etch-back process. First, a gate conductive layer is deposited to gap-fill the first trench 36 over the gate insulation layer 37. The gate conductive layer may include a titanium nitride (TiN) layer, a tantalum nitride (TaN) layer, or a tungsten (W) layer. For example, the buried gate 38 may be formed by conformally depositing a thin titanium nitride (TiN) layer or a thin tantalum nitride (TaN) layer, which has a large work function, and then gap-filling a tungsten layer to decrease resistance. Also, the buried gate 38 may be formed by stacking a titanium nitride (TiN) layer and a tantalum nitride (TaN) layer or sequentially stacking a titanium nitride (TiN) layer, a tantalum nitride (TaN) layer, and a tungsten (W) layer. Herein, the titanium nitride (TiN) layer may be formed to have a thickness ranging from approximately 20 Å to approximately 80 Å. Subsequently, a CMP process and an etch-back process are sequentially performed. The upper surface of the buried gate 38 may be lower than the surface of the substrate 31.

Figure 3D:
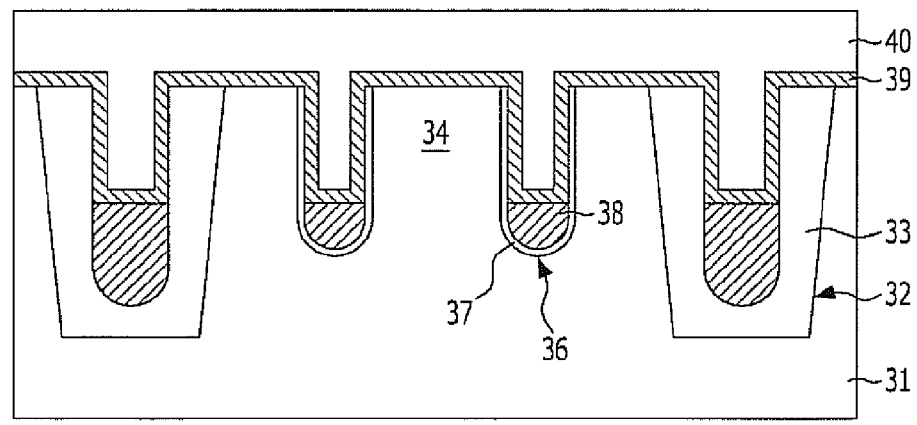

Referring to FIG. 3D, the hard mask pattern 35 is removed, and a diffusion barrier 39 is formed over the substrate 31 including the buried gate 38. The diffusion barrier 39 includes a nitride layer. The diffusion barrier 39 prevents a metal material used for forming the buried gate 38 from being diffused.

Subsequently, a gap-filling layer 40 for gap-filling the upper portion of the buried gate 38 is formed over the diffusion barrier 39. The gap-filling layer 40 includes an oxide layer. With the oxide layer, the parasitic capacitance between the buried gate 38 and a buried bit line, which will be formed later, may be reduced. The gap-filling layer 40 may be an oxide layer having a low dielectric constant (k) in order to decrease the parasitic capacitance.

Figure 3E:
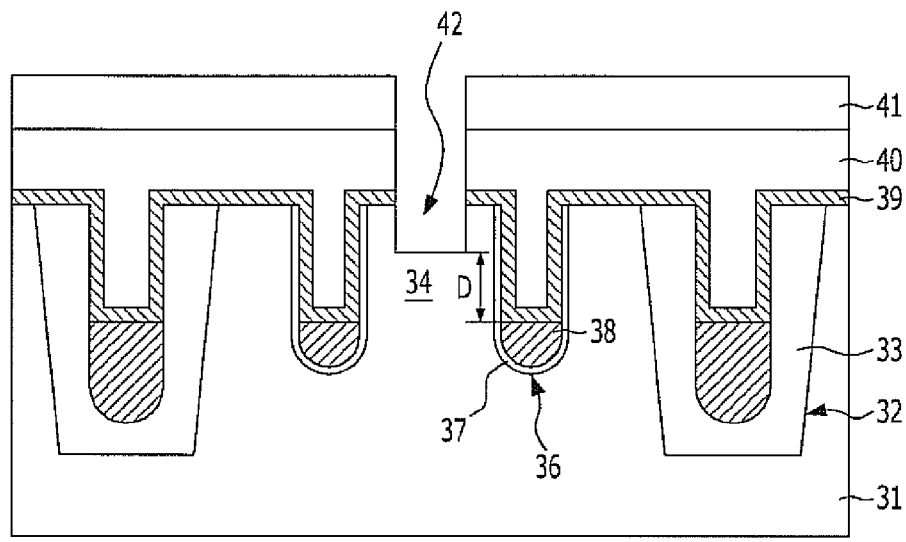

Referring to FIG. 3E, a second trench 42 is formed by using the buried bit line mask 41 and sequentially etching the gap-filling layer 40, the diffusion barrier 39, and the substrate 31 in the region to contact with a bit line. Particularly, the second trench 42 is formed by etching the active region 34 between neighboring buried gates 38 to a predetermined depth, and the depth of the second trench 42 is shallower than the depth of the first trench 36. Accordingly, the second trench 42 may have a depth difference D from the buried gate 38. In other words, the second trench 42 is formed at a position higher than the surface of the buried gate 38.

As a result, the height of the active region 34 to contact with a bit line, which will be formed subsequently, becomes low due to the second trench 42.

Figure 3F:
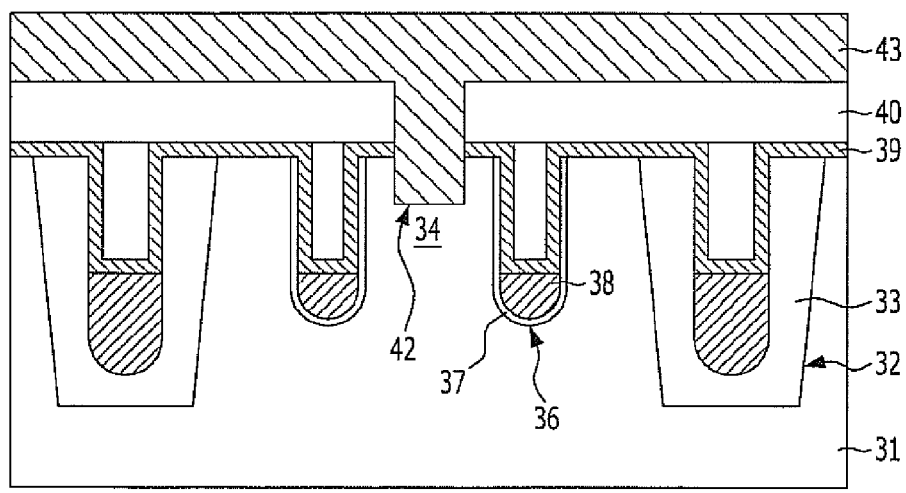

Referring to FIG. 3F, after the buried bit line mask is removed, a bit line conductive layer 43 is deposited over the substrate structure to fill the second trench 42. The bit line conductive layer 43 includes a metal-based material such as a titanium nitride or tungsten. Also, the bit line conductive layer 43 may include copper (Cu).

Figure 3G:
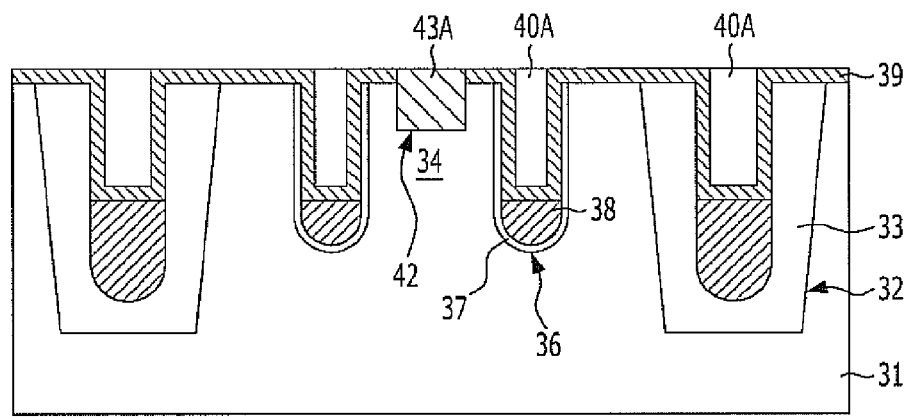

Referring to FIG. 3G, a buried bit line 43A filling the inside of the second trench 42 is formed through a CMP process. The depth of the buried bit line 43A is controlled to be shallower than the depth of the buried gate 38. With the height difference between the buried bit line 43A and the buried gate 38, the interference and short between the buried bit line 43A and the buried gate 38 are prevented.

During the CMP process, not only the bit line conductive layer 43 but also the gap-filling layer 40 are polished, and the diffusion barrier 39 is used as a polish stop layer. As a result, the diffusion barrier 39 and a gap-filling layer pattern 40A remain in the upper portion of the buried gate 38.

According to this embodiment of the present invention, a Damascene process is used when the bit line is formed. To be specific, after the second trench 42 is formed, the buried bit line 43A is formed by forming a bit line filling the inside of the second trench 42. As a result, both buried gate 38 and buried bit line 43A are formed to fill the inside of the active region 34.

Figure 3H:
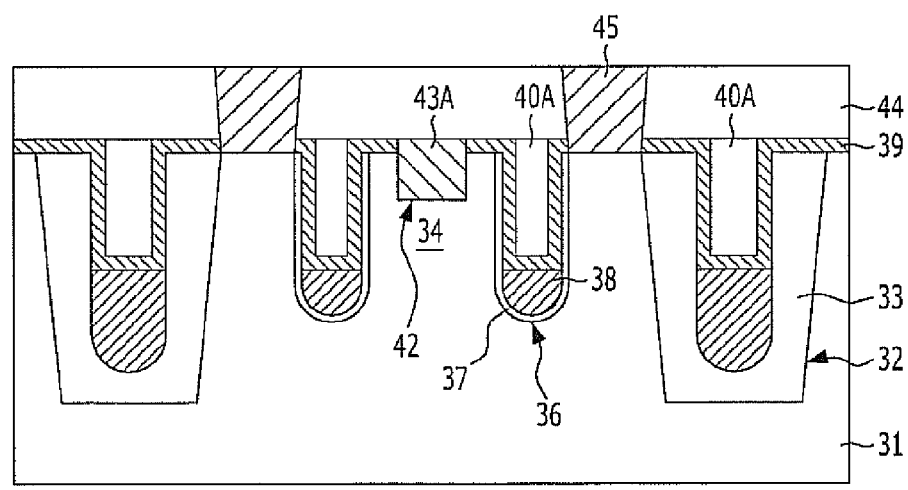

Referring to FIG. 3H, after the inter-layer dielectric layer 44 is formed, a process for forming a storage node contact is performed. As a result, a storage node contact 45 coupling both ends of the active region 34 is formed.

According to the first embodiment of the present invention, the semiconductor device includes both buried gate 38 and buried bit line 43A. Since the buried bit line 43A is formed to fill the inside of the active region 34, it does not have to perform a bit line spacer forming process. Also, since the buried bit line 43A is formed to fill the inside of the active region 34, more process margins may be secured during the process for forming the storage node contact 45. Also, since the buried bit line 43A is formed to be buried, a bridging between the buried bit line 43A and the storage node contact 45 is structurally prevented.

Meanwhile, when the buried bit line 43A is formed of copper, a diffusion barrier against copper, which is simply referred to as a copper diffusion barrier, hereafter, may be additionally formed to prevent the copper from being diffused. The copper diffusion barrier may include a nitride layer.

Figure 3I:
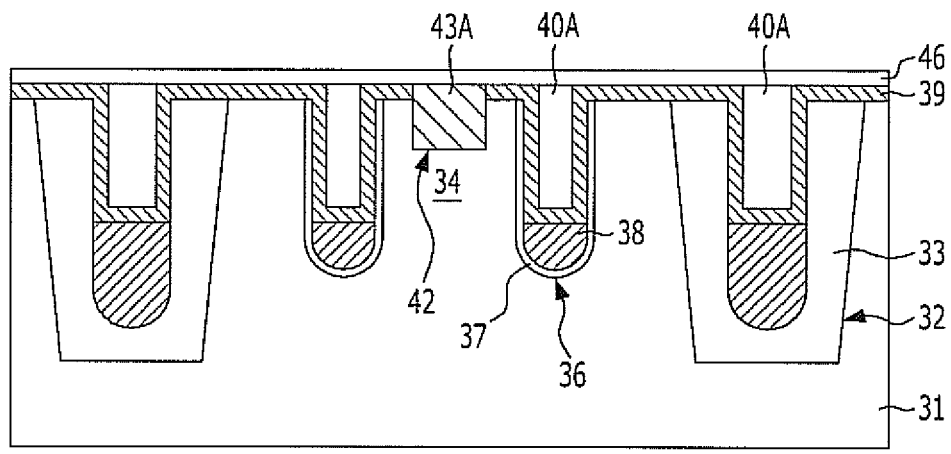
FIG. 3I is a cross-sectional view illustrating buried bit lines formed in accordance with a second embodiment of the present invention.

FIG. 3I is a cross-sectional view illustrating buried bit lines formed in accordance with a second embodiment of the present invention. According to the structure shown in FIG. 3I, when the buried bit line 43A is a copper layer, a copper diffusion barrier 46 is additionally formed over the substrate structure including the buried bit line 43A. The other constituent elements except the copper diffusion barrier 46 are the same as shown in FIG. 3G.

Figure 4A:
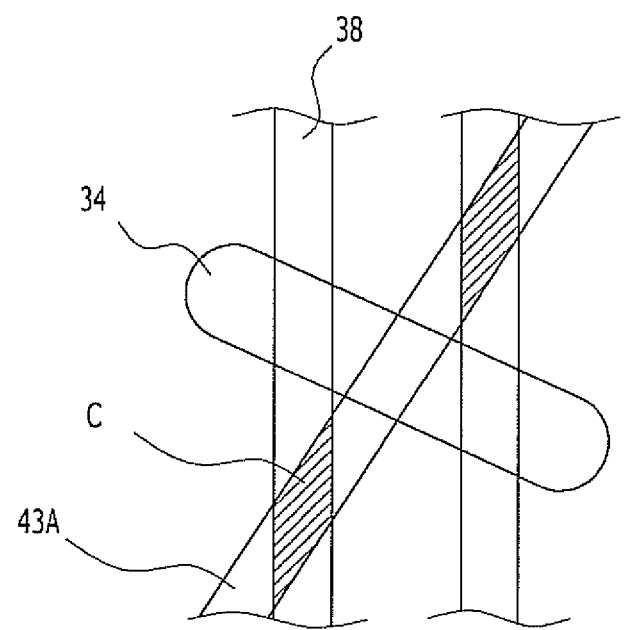
FIGS. 4A and 4B are layouts of the semiconductor devices in accordance with the first and second embodiments of the present invention, respectively.
Figure 4B:
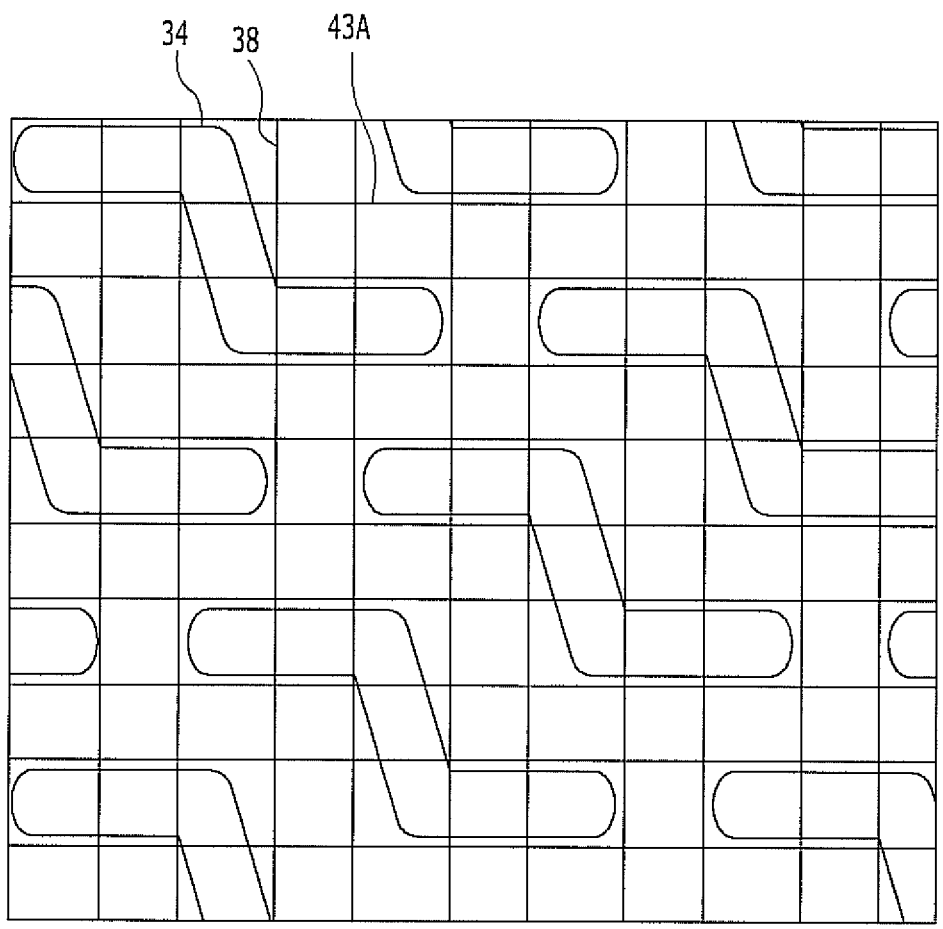

Cells are laid out in the types of FIGS. 4A and 4B in order to form buried gates and buried bit lines in accordance with the first and second embodiments of the present invention.

FIGS. 4A and 4B are layouts of the semiconductor devices in accordance with the first and second embodiments of the present invention, respectively.

Referring to FIG. 4A, when the active regions 34 are formed in the shape of a linear island, the buried gate 38 and the buried bit line 43A are not crossed perpendicularly, but the angle between the buried gate 38 and the buried bit line 43A need to be formed as shown in FIG. 4A. This is because the intersection point C between the buried gate 38 and the buried bit line 43A needs to be formed not in the active region 34 but in the region of isolation layer. When the intersection point C is formed in the active region 34, the storage node contact and the buried bit line 43A may be directly coupled to each other so as to be shorted.

Referring to FIG. 4B, when the active regions 34 are formed in the layout shown in FIG. 4B, the buried gate 38 and the buried bit line 43A may be formed perpendicularly to each other, which conforms to conventional technology. In this case, it is difficult to form the active regions 34.

Therefore, it is desirable to form the active regions 34, the buried gate 38, and the buried bit line 43A in the layout shown in FIG. 4A.

Figure 5:
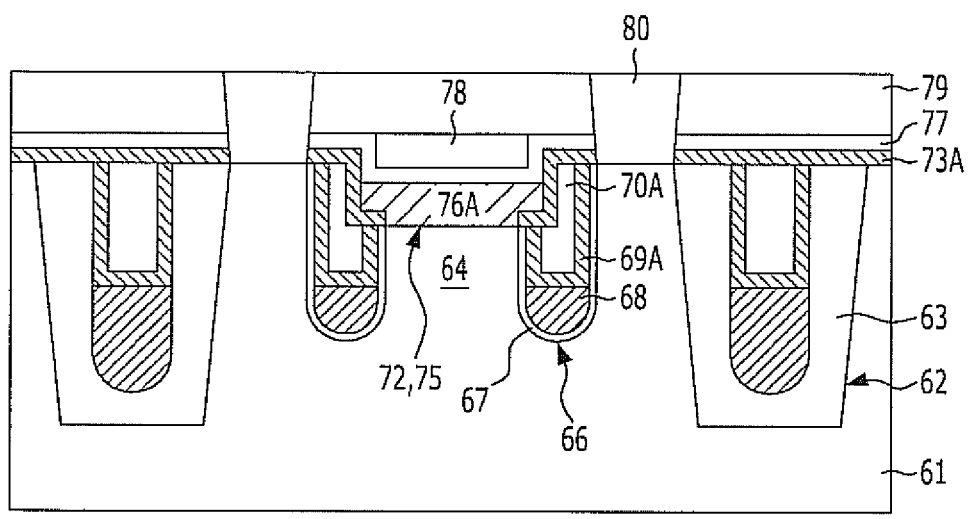
FIG. 5 is a cross-sectional view illustrating the semiconductor device fabricated in accordance with a third embodiment of the present invention.

FIG. 5 is a cross-sectional view illustrating the semiconductor device fabricated in accordance with a third embodiment of the present invention.

Referring to FIG. 5, the semiconductor device includes a plurality of first trenches 66 formed in the inside of an active region 64, a buried gate 68 filling a portion of the inside of an individual first trench 66, a second trench 72 formed to be extended in a direction crossing the buried gates 68, a third trench 75 formed in a direction crossing the second trench 72 between buried gates 68, and a buried bit line 76A filling the third trench 75 and the second trench 72. The semiconductor device also includes storage node contacts 80 formed at both ends of the active region 64 to penetrate a second inter-layer dielectric layer 79.

Each active region 64 is defined by an isolation layer 63 over a substrate 61, and the active region 64 has a shape of island slanted in an oblique direction. The isolation layer 63 is formed to fill an isolation trench 62 through a Shallow Trench Isolation (STI) process.

The buried gate 68 and the buried bit line 76A are formed crossing each other.

The second trench 72 and the third trench 75 have a shallower depth than the first trench 66, and the second trench 72 is formed at a position higher than the surface of the buried gate 68 to isolate the buried bit line 76A from the buried gate 68. A gate insulation layer 67 is formed on the surface of the first trench 66. A diffusion barrier 69A and a gap-filling layer pattern 70A are formed in the upper portion of the buried gate 68 which fills a portion of the first trench 66. A bit line spacer layer pattern 73A is formed on the sidewalls of the second trench 72, and a spacer layer 77 and a first inter-layer dielectric layer 78 are formed in the upper portion of the buried bit line 76A. The first inter-layer dielectric layer 78 is formed only in the upper portion of the buried bit lien 76A, and the spacer layer 77 is formed over the substrate structure. The third trench 75 will be described later with reference to FIGS. 6H and 7E.

The buried bit line 76A includes a metal material, which is a titanium nitride layer, a tungsten layer, or a copper layer. When the copper layer is used, the buried bit line 76A may further include a diffusion barrier against copper, which may be simply referred to as a copper diffusion barrier. The copper diffusion barrier includes a nitride layer.

According to the structure shown in FIG. 5, the semiconductor device according to the third embodiment includes both buried gate 68 and buried bit line 76A.

FIGS. 6A to 6L are cross-sectional views describing a process for fabricating the semiconductor device in accordance with the third embodiment of the present invention.

Figure 6A:
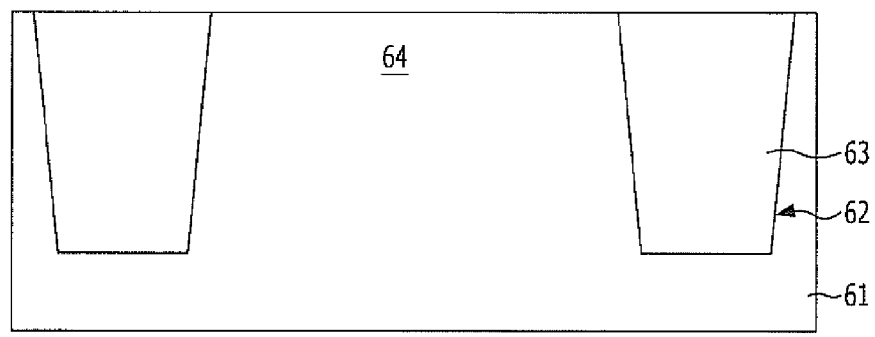
FIGS. 6A to 6L are cross-sectional views describing a process for fabricating the semiconductor device in accordance with the third embodiment of the present invention.

Referring to FIG. 6A, an isolation layer 63 is formed over the substrate 61 by performing a Shallow Trench Isolation (STI) process. Herein, the isolation layer 63 is formed by etching the substrate to a predetermined depth so as to form an isolation trench 62 and gap-fill the isolation trench 62 with an insulation layer such as a spin on dielectric (SOD) material or high-density plasma oxide (HDP). After gap-filling the isolation trench 32 with the insulation layer, a planarization process such as a Chemical Mechanical Polishing (CMP) may be performed.

With the isolation layer 63 formed, the other area of the substrate 631 is defined as active regions 64. The active regions 64 may be laid out in a shape of island slanted at a predetermined angle in an oblique direction to cope with high-integration design rule of under $6F^2$.

Figure 6B:
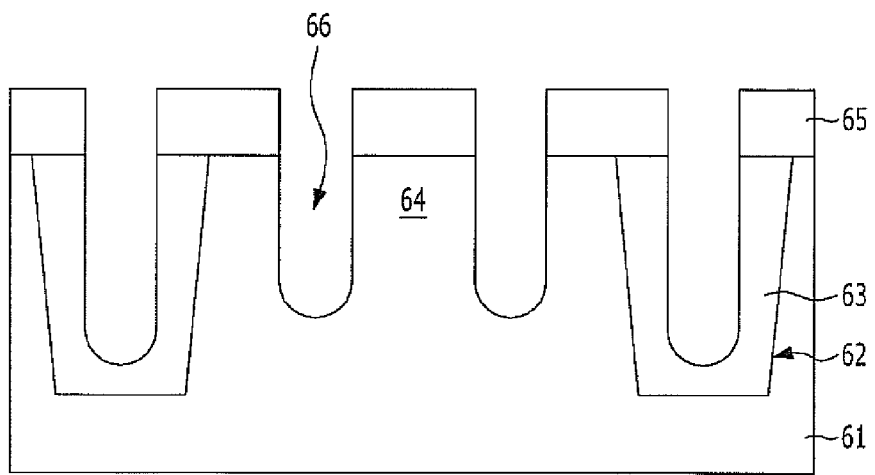

Referring to FIG. 6B, mask and etch processes are performed to form buried gates. For example, a hard mask pattern 65 is formed using a buried gate mask (not shown). The hard mask pattern 65 may include an oxide layer or a nitride layer. Subsequently, the substrate 61, particularly the active region 64, is etched using the hard mask pattern 65 as an etch barrier. As a result, a first trench 66 having a predetermined depth is formed, and the first trench 66 may be formed by simultaneously etching the active region 64 and the isolation layer 63.

The first trench 66 is a trench which will be filled with a buried gate. The depth of the first trench 66 is shallower than that of the isolation trench 62 filled with the isolation layer 63. Also, the depth of the first trench 66 may be deeper than that of a trench according to conventional technology in order to be sufficiently isolated from a buried bit line which is to be formed subsequently.

Figure 6C:
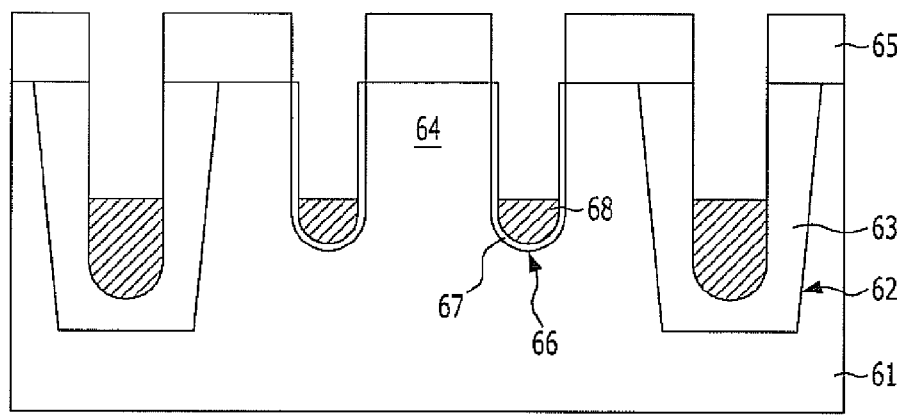

Referring to FIG. 6C, after a gate insulation layer 67 is formed on the surface of the first trench 66, the buried gate 68 filling a portion of the first trench 66 is formed.

The method for forming the buried gate 68 may be performed in a sequence of depositing a gate conductive layer, performing a CMP process, and performing an etch-back process. First, a gate conductive layer is deposited to gap-fill the first trench 66 over the gate insulation layer 67. The gate conductive layer 67 includes a titanium nitride (TiN) layer, a tantalum nitride (TaN) layer, or a tungsten (W) layer. For example, the buried gate 68 may be formed by conformally depositing a thin titanium nitride (TiN) layer or a thin tantalum nitride (TaN) layer, which has a large work function, and then gap-filling a tungsten layer to decrease resistance. Also, the buried gate 68 may be formed by stacking a titanium nitride (TIN) layer and a tantalum nitride (TaN) layer or sequentially stacking a titanium nitride (TIN) layer, a tantalum nitride (TaN) layer, and a tungsten (W) layer. Herein, the titanium nitride (TiN) layer may be formed to have a thickness ranging from approximately 20 Å to approximately 80 Å. Subsequently, a CMP process and an etch-back process are sequentially performed. The upper surface of the buried gate 68 may be lower than the surface of the substrate 61.

Figure 7A:
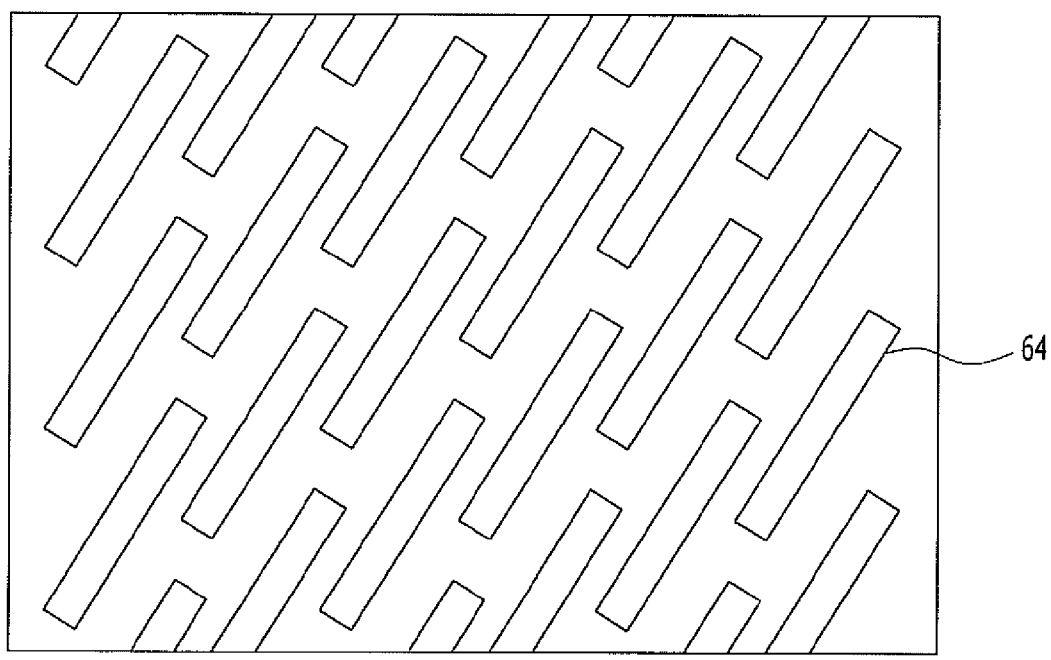
FIG. 7A is a plan view illustrating active regions of the semiconductor device fabricated in accordance with the third embodiment of the present invention.
Figure 7B:
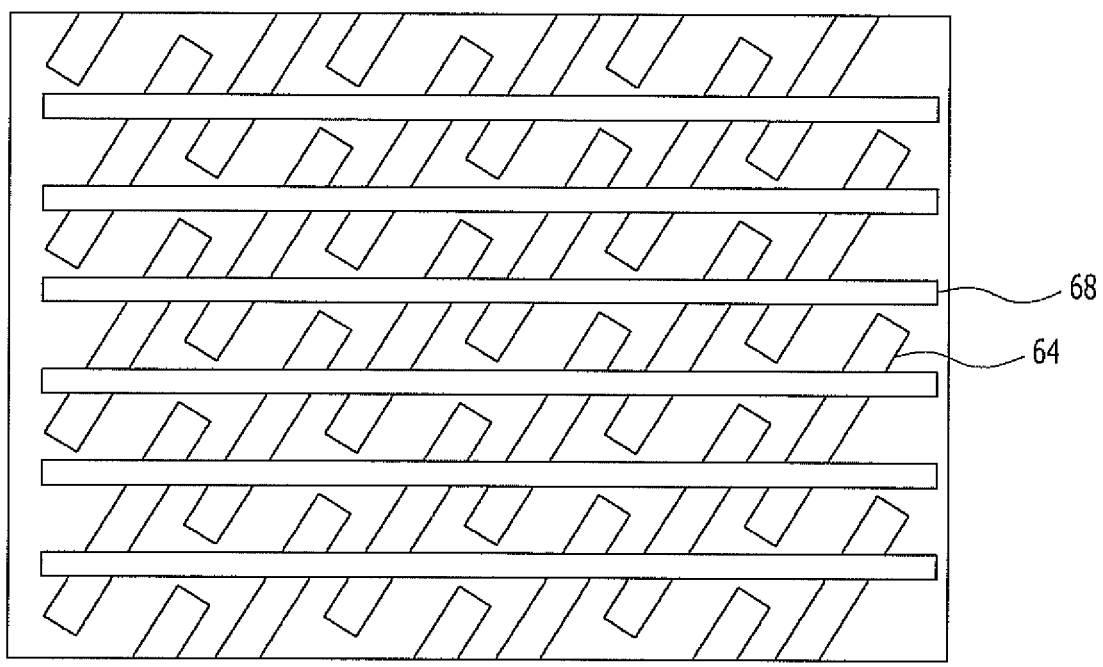
FIG. 7B is a plan view illustrating buried gates of the semiconductor device fabricated in accordance with the third embodiment of the present invention.

FIG. 7B is a plan view showing the buried gates. In the drawing, two buried gates 68 are crossing the active regions 64.

Figure 6D:
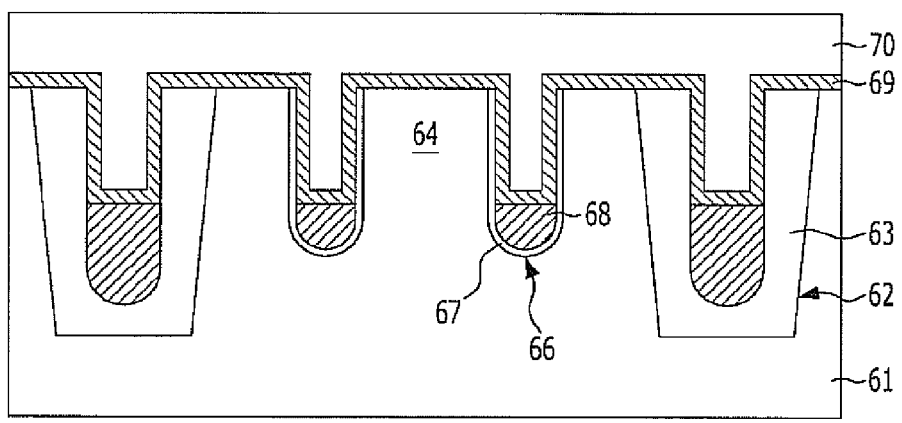

Referring to FIG. 6D, the hard mask pattern 65 is removed, and a diffusion barrier 69 is formed over the substrate 61 including the buried gate 68. The diffusion barrier 69 includes a nitride layer. The diffusion barrier 69 prevents a metal material used for forming the buried gate 68 from being diffused.

Subsequently, a gap-filling layer 70 for gap-filling the upper portion of the buried gate 68 is formed over the diffusion barrier 69. The gap-filling layer 70 includes an oxide layer. With the oxide layer, the parasitic capacitance between the buried gate 68 and a buried bit line, which will be formed later, may be reduced. The gap-filling layer 70 may be an oxide layer having a low dielectric constant (k) in order to decrease the parasitic capacitance between the buried gate 68 and the buried bit line, which will be formed later. Herein, the oxide layer having a low dielectric constant includes an oxide layer having a dielectric constant of approximately 3 or lower.

Figure 6E:
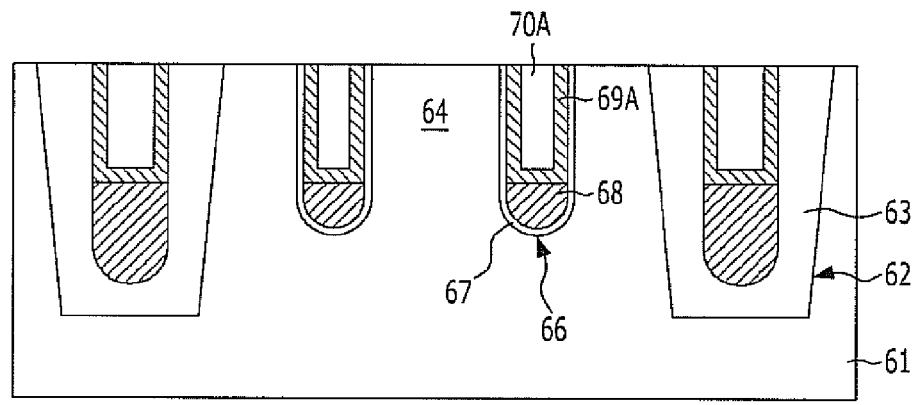

Referring to FIG. 6E, a CMP process is performed until the surface of the substrate 61 is exposed. In short, both of the gap-filling layer 70 and the diffusion barrier 69 are polished at the same time. As a result, the diffusion barrier pattern 69A and a gap-filling layer pattern 70A remain in the upper portion of the buried gate 68.

Figure 6F:
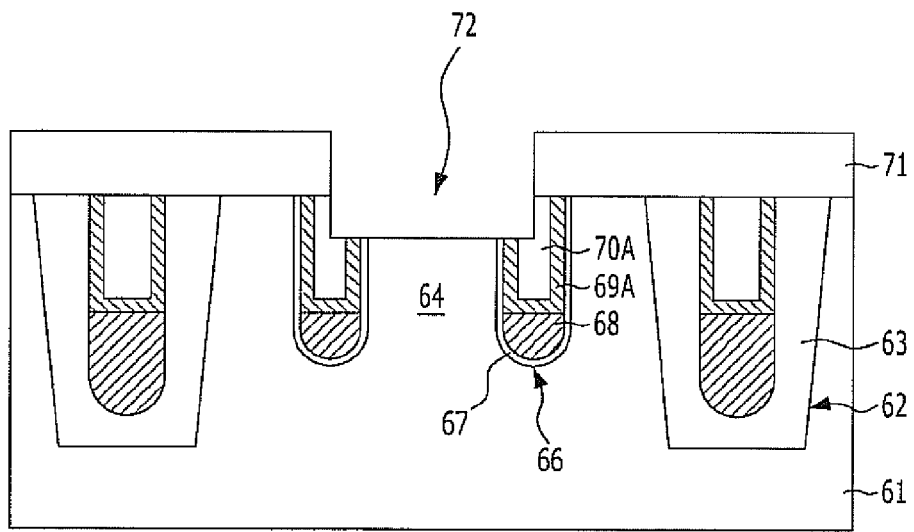

Referring to FIG. 6F, a second trench 72 is formed by using the buried bit line mask 71 and sequentially etching the gap-filling layer 70A, the diffusion barrier 69, and the substrate 61 in the region to contact with a bit line. More particularly, the second trench 72 is formed by simultaneously etching the active region 64 and the isolation layer 63 to a predetermined depth to be extended in a direction crossing the buried gate 68, and the depth of the second trench 72 is shallower than the depth of the first trench 66. Meanwhile, when the second trench 72 is formed, the diffusion barrier 69 and the inter-layer dielectric layer 74 in the upper portion of the buried gate 68 may be partially lost at both ends of the second trench 72.

After all, the active region 64 contacting a bit line, which will be formed later, becomes lower due to the second trench 72. The second trench 72 is patterned in a direction crossing the buried gate 68.

Figure 7C:
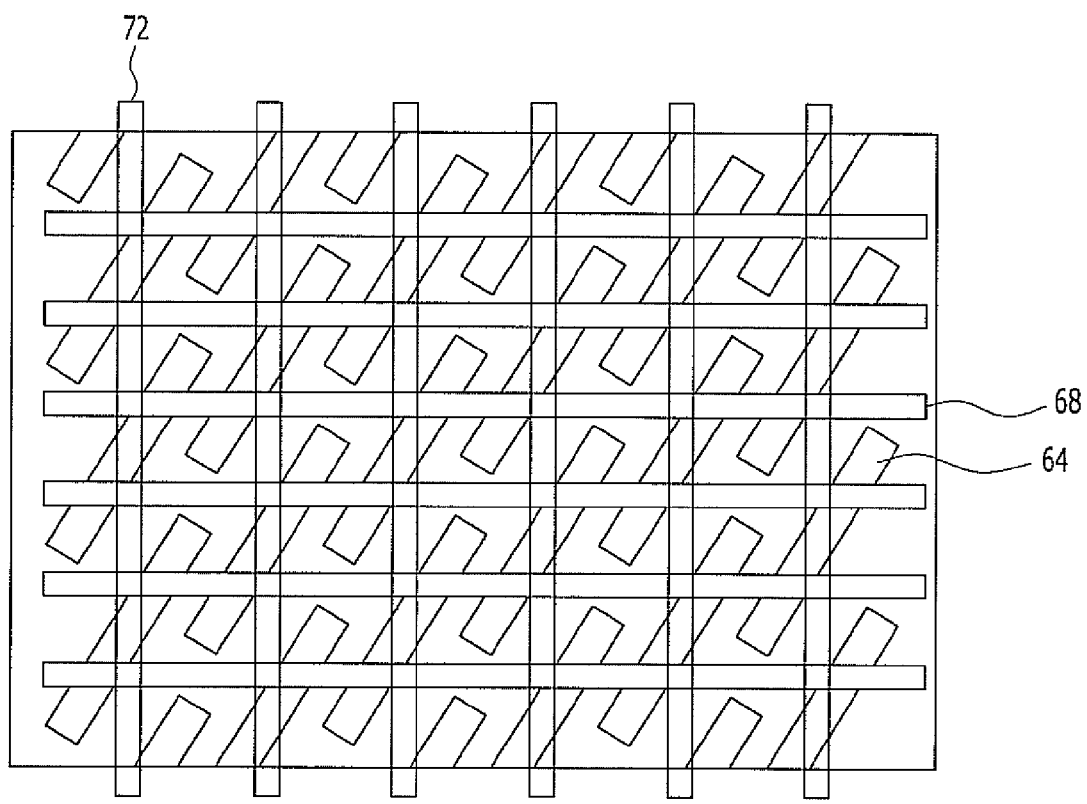
FIG. 7C is a plan view illustrating second trenches of the semiconductor device fabricated in accordance with the third embodiment of the present invention.

FIG. 7C is a plan view illustrating the second trench 72. According to the structure shown in the drawing, the second trench 72 to be filled with a bit line is extended in a direction crossing the buried gate 68. Also, the second trenches have a shape of going through the central area of the active region 64. Of course, the second trench 72 as well is formed by simultaneously etching the active region 64 and the isolation layer 63, just as the first trench 66 is formed. When the second trench 72 is formed, the upper portion of the buried gate 68, the diffusion barrier 69, and the gap-filling layer 70 may be partially etched.

Figure 6G:
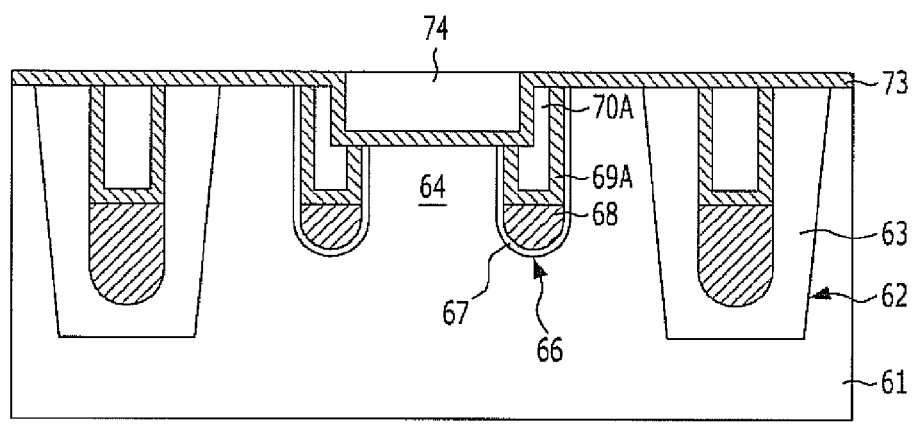

Referring to FIG. 6G, after the buried bit line mask is removed, a bit line spacer layer 73 is deposited over the substrate structure.

Herein, the bit line spacer layer 73 may include a nitride layer. When the bit line spacer layer 73 is used, a buried bit line may be formed regardless of the shape of the active region 64.

Subsequently, a sacrificial layer 74 is formed over the bit line spacer layer 73 to gap-fill the second trench 72. The sacrificial layer may include a carbon-based material. Subsequently, the sacrificial layer 74 is planarized so that the sacrificial layer 74 remains only in the inside of the second trench 72.

Figure 6H:
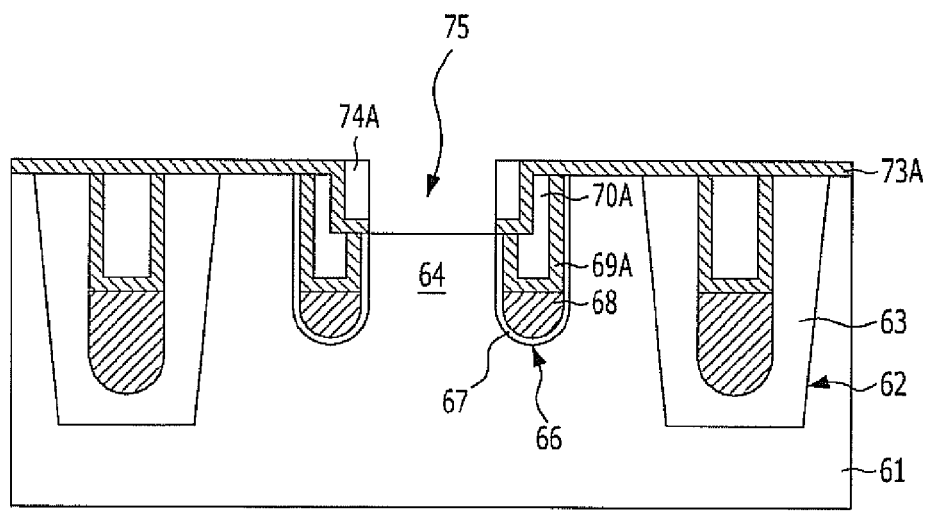

Referring to FIG. 6H, the sacrificial layer 74 and the bit line spacer layer 73 are etched to selectively open only the contact region between the buried bit line and the active region 64. Accordingly, a third trench 75 is open in the active region 64. A sacrificial layer pattern 74A remains on both sides of the third trench 75, and the bit line spacer layer pattern 73A is etched to expose the surface of the active region 64. For example, when the second trench 72 has a form extended in a first direction, the third trench 75 may be a rectangle stretched in a second direction crossing the second trench 72. After all, the third trench 75 is one obtained by extending the second trench 72 between the buried gates 68 in any one direction.

Figure 7D:
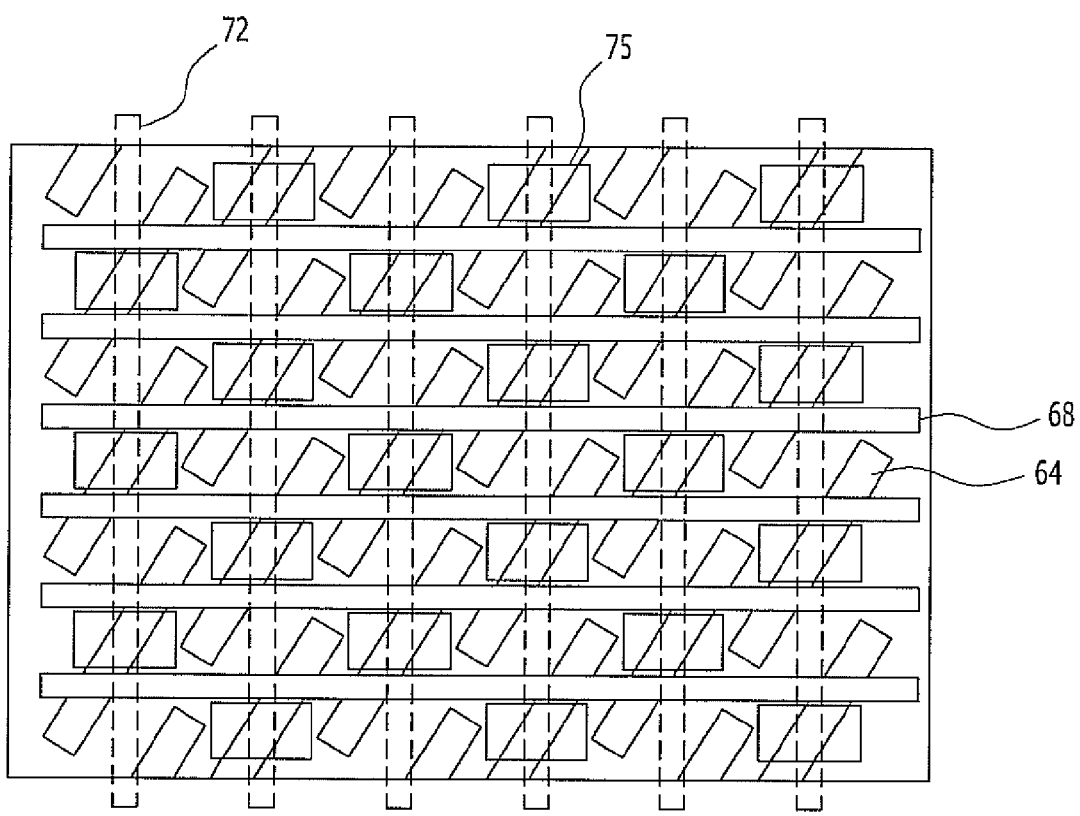
FIG. 7D is a plan view illustrating third trenches of the semiconductor device fabricated in accordance with the third embodiment of the present invention.

FIG. 7D is a plan view illustrating the third trench 75. The third trench 75 is formed over the active region between the buried gates 68, and the third trench 75 has a rectangular shape. In addition, the third trench 75 may be formed in a direction crossing the second trench 72 between the buried gates 68. In other words, the third trench 75 is formed in parallel to the buried gates 68 and it is not coupled with neighboring third trenches 75.

Figure 6I:
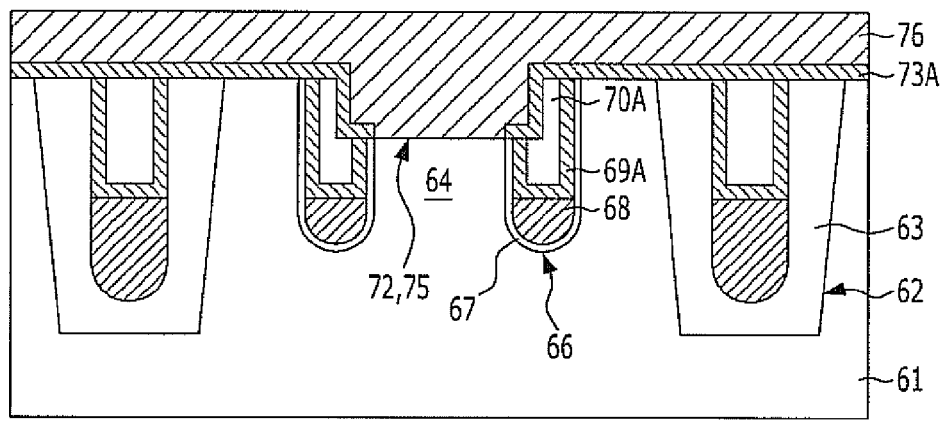

Referring to FIG. 6I, all of the sacrificial layer pattern 74A is removed. Since the sacrificial layer pattern 74A is of a carbon-based material, a stripping process using oxygen plasma is used.

Subsequently, a bit line conductive layer 76 is deposited over the substrate structure so as to fill the space from which the sacrificial layer pattern 74A is removed, that is, the third trench 75 and the second trench 72. The bit line conductive layer 76 includes a metal-based material, such as a titanium nitride or tungsten.

Figure 6J:
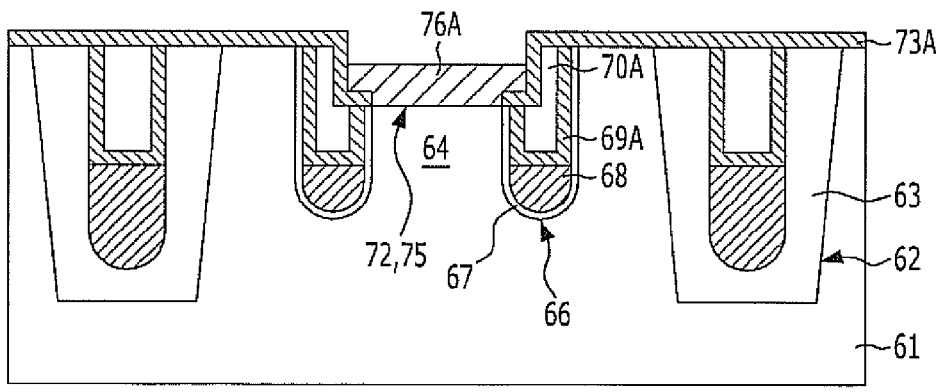

Referring to FIG. 6J, an etch-back process is performed so as to form a buried bit line 76A. The height of the buried bit line 76A is controlled to be lower than the surface of the substrate, just as the buried gate 68. This reason the buried bit line 76A is formed lower than the surface of the substrate is to secure overlay margins for a subsequent process for forming a storage node contact.

Figure 7E:
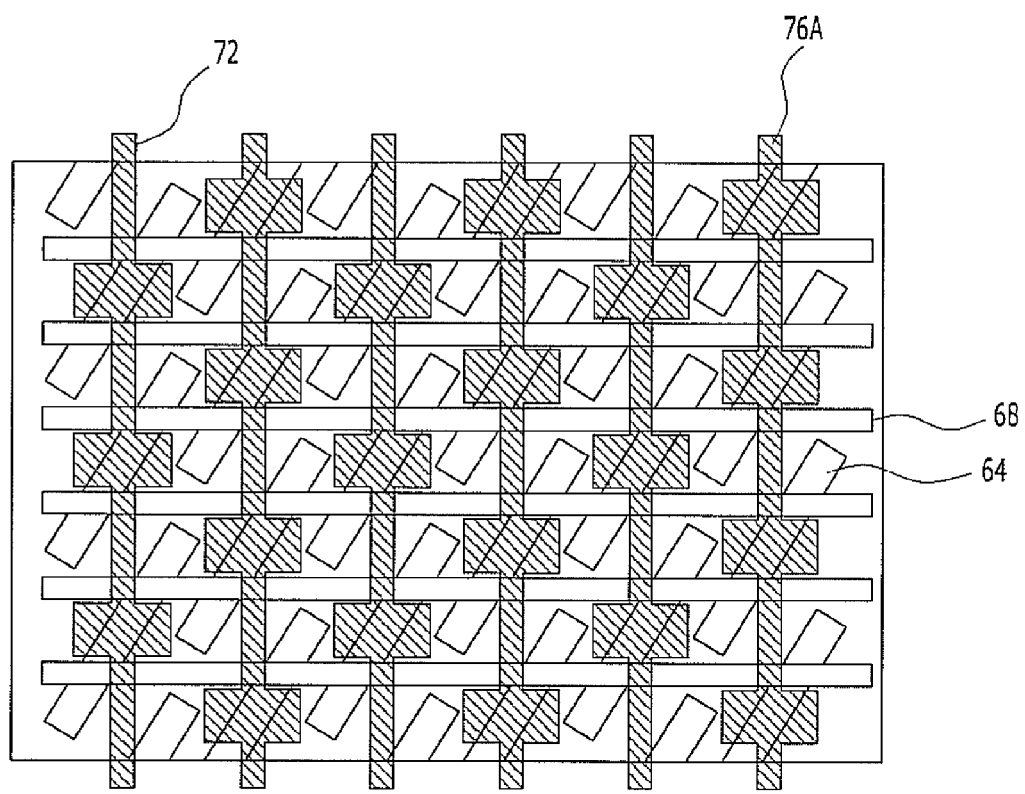
FIG. 7E is a plan view illustrating buried bit lines of the semiconductor device fabricated in accordance with the third embodiment of the present invention.

FIG. 7E is a plan view showing the buried bit line 76A. The buried bit line 76A is formed filling the second trench and the third trench. Also, the buried bit line 76A is extended in a direction crossing the buried gate 68. The buried bit line 76A has a cross structure due to the portion filling the third trench 75.

Figure 6K:
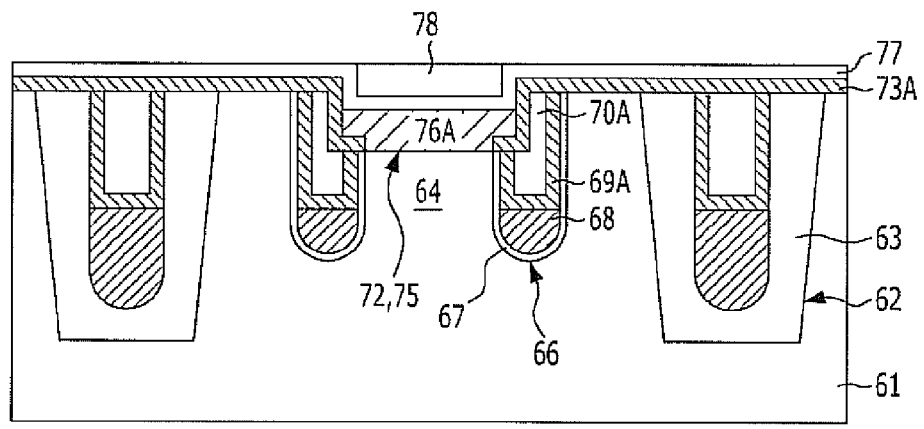

Referring to FIG. 6K, after a spacer layer 77 is deposited, a first inter-layer dielectric layer 78 is deposited over the spacer layer 77 to gap-fill the upper portion of the buried bit line 76A.

Subsequently, the first inter-layer dielectric layer 78 is planarized. Herein, the first inter-layer dielectric layer 78 may include an oxide layer.

Figure 6L:
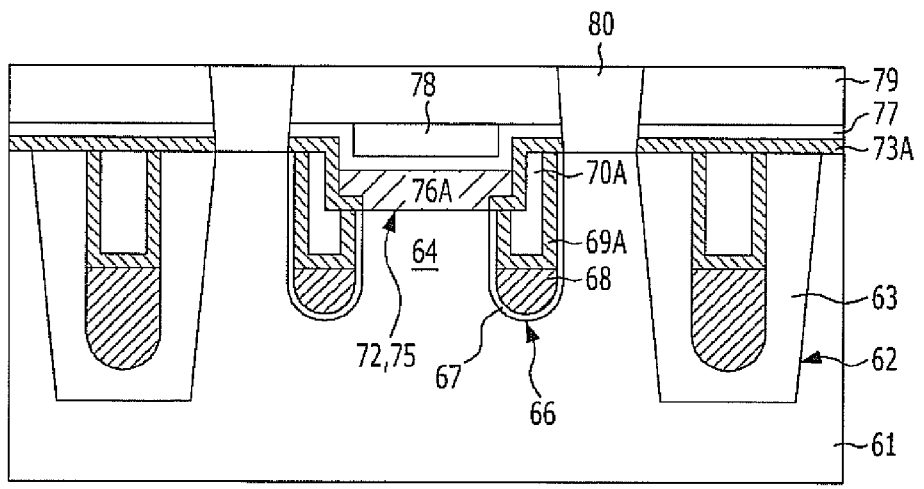

Referring to FIG. 6L, after a second inter-layer dielectric layer 79 is formed over the substrate structure, a process for forming a storage node contact is performed. As a result, a storage node contact 80 is formed.

According to the third embodiment of the present invention, the semiconductor device includes both buried gate 68 and the buried bit line 76A. Since the buried bit line 76A is formed to fill the inside of the active region 64, more process margins may be secured during the process for forming the storage node contact 80. Also, since the buried bit line 76A is formed to be buried, a bridging between the buried bit line 76A and the storage node contact 80 is prevented in terms of structure.

Meanwhile, when the buried bit line 76A is formed of copper, a copper diffusion barrier may be additionally formed to prevent the copper from being diffused. Herein, the copper diffusion barrier may include a nitride layer.

According to the technology of the present invention, buried bit lines are formed to fill the active regions. Therefore, the resistance caused by the cross-sectional area of a bit line may be decreased so as to achieve high-speed operation. Also, resistance caused by diverse contacts may be removed, which leads to even higher operation speed.

Moreover, since the buried bit lines are formed to fill the active regions according to the technology of the present invention, process margins are secured during a process of forming storage node contacts.

In addition, since the buried bit lines are formed to fill the active regions, it is possible to prevent the bridging between the buried bit line and the storage node contact.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a plurality of first trenches formed inside a plurality of active regions;
   a plurality of buried gates configured to partially fill insides of the plurality of the first trenches;
   a plurality of second trenches formed to be extended in a direction crossing the plurality of the buried gates; and
   a plurality of buried bit lines, formed at positions higher than an upper surface of each of the plurality of the buried gates, configured to fill the plurality of second trenches.

2. The semiconductor device of claim 1, further comprising:

a plurality of third trenches formed in a direction crossing the plurality of the second trenches between the plurality of the buried bit lines, wherein the plurality of the buried bit lines to partially fill the plurality of the third trenches.

3. The semiconductor device of claim 2, further comprising:

a bit line spacer layer formed on both sidewalls of each of the second trenches;

an inter-layer dielectric layer configured to gap-fill an upper portion of each buried bit line; and a spacer layer between the plurality of the buried bit lines and the inter-layer dielectric layer.

4. The semiconductor device of claim 1, wherein the plurality of the active regions are defined by an isolation layer over a substrate, and the plurality of the active regions are laid out to have a shape of island slanted in an oblique direction.

5. The semiconductor device of claim 4, wherein the plurality of the buried gates and the plurality of the buried bit lines are formed crossing each other, and intersection points between the buried gates and the buried bit lines are positioned in an upper portion of the isolation layer.

6. The semiconductor device of claim 1, wherein the plurality of the second trenches are formed at positions higher than a surface of the plurality of the buried gates.

7. A method for fabricating a semiconductor device, the method comprising:

forming a plurality of buried gates to fill insides of a plurality of active regions;

forming a plurality of trenches by etching the plurality of the active regions between the plurality of the buried gates; and forming a plurality of buried bit lines, at positions higher than an upper surface of each of the plurality of the buried gates, to fill the plurality of the trenches.

8. The method of claim 7, wherein the plurality of the active regions are defined by an isolation layer over a substrate, and the plurality of the active regions are laid out to have a shape of island slanted in an oblique direction.

9. The method of claim 8, wherein the plurality of the buried gates and the plurality of the buried bit lines are formed crossing each other, and intersection points between the buried gates and the buried bit lines are positioned in an upper portion of the isolation layer.

10. The method of claim 7, wherein the plurality of the trenches are formed at positions higher than a surface of the plurality of the buried gates.

11. A method for fabricating a semiconductor device, the method comprising:

forming a plurality of first trenches by etching a substrate;

forming a plurality of buried gates to fill the plurality of the first trenches;

forming a plurality of second trenches by etching the substrate in a direction crossing the plurality of the buried gates;

forming a plurality of third trenches by extending the plurality of the second trenches in parallel to the plurality of the buried gates; and forming a plurality of buried bit lines to fill the plurality of the third trenches and the plurality of the second trenches.

12. The method of claim 11, wherein the plurality of the second trenches are formed at positions higher than a surface of the plurality of the buried gates.

13. The method of claim 11, wherein the plurality of the active regions are defined by an isolation layer over the substrate, and the plurality of the active regions are laid out to have a shape of island slanted in an oblique direction.

14. The method of claim 13, wherein the plurality of the first trenches and the plurality of the second trenches are formed by simultaneously etching the plurality of the active regions and the isolation layer, and the plurality of the second trenches are formed shallower than the plurality of the first trenches.

15. The method of claim 11, wherein the forming the plurality of the buried bit lines comprises:

forming a bit line spacer layer to cover a substrate including the plurality of the second trenches;

forming a sacrificial layer over the bit line spacer layer to gap-fill the plurality of the second trenches;

opening the plurality of the third trenches extending the plurality of the second trenches between the plurality of the buried gates by selectively etching the sacrificial layer and the bit line spacer layer;

removing the sacrificial layer;

forming a bit line conductive layer over the substrate to fill the plurality of the second trenches and the plurality of the third trenches; and performing an etch-back process onto the bit line conductive layer to a depth lower than a surface of the substrate.

* * * * *